(12) United States Patent
Chang et al.

(10) Patent No.: US 11,189,788 B2
(45) Date of Patent: Nov. 30, 2021

(54) RRAM BOTTOM ELECTRODE

(71) Applicant: Taiwan Semiconductor Manufacturing Co., Ltd., Hsin-Chu (TW)

(72) Inventors: Fu-Chen Chang, Hsinchu (TW); Kuo-Chi Tu, Hsin-Chu (TW); Wen-Ting Chu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 130 days.

(21) Appl. No.: 16/395,620

(22) Filed: Apr. 26, 2019

(65) Prior Publication Data

US 2020/0136040 A1 Apr. 30, 2020

Related U.S. Application Data

(60) Provisional application No. 62/752,593, filed on Oct. 30, 2018.

(51) Int. Cl.
*H01L 27/24* (2006.01)
*H01L 45/00* (2006.01)

(52) U.S. Cl.
CPC ...... *H01L 45/1253* (2013.01); *H01L 45/1675* (2013.01); *H01L 27/2436* (2013.01); *H01L 45/06* (2013.01); *H01L 45/1233* (2013.01)

(58) Field of Classification Search
CPC ....... H01L 45/06; H01L 45/12; H01L 45/123; H01L 45/1233; H01L 45/125; H01L 45/1253; H01L 45/16; H01L 45/167; H01L 45/1675; H01L 27/24; H01L 27/243; H01L 27/2436

USPC ........................................................... 257/4
See application file for complete search history.

(56) References Cited

U.S. PATENT DOCUMENTS

| | | | |
|---|---|---|---|
| 9,583,700 B2 | 2/2017 | Lee et al. | |
| 10,164,018 B1 | 12/2018 | Yang et al. | |
| 10,658,586 B2 * | 5/2020 | Clarke | H01L 45/1633 |
| 2015/0287917 A1 | 10/2015 | Dang et al. | |
| 2016/0380193 A1 * | 12/2016 | Chen | H01L 27/2436 257/4 |
| 2017/0141305 A1 | 5/2017 | Yang et al. | |
| 2017/0213959 A1 | 7/2017 | Gibson et al. | |
| 2018/0097173 A1 | 4/2018 | Chuang et al. | |

(Continued)

FOREIGN PATENT DOCUMENTS

WO 2018182649 A1 10/2018

*Primary Examiner* — Monica D Harrison
(74) *Attorney, Agent, or Firm* — Eschweiler & Potashnik, LLC (57) ABSTRACT

An integrated circuit device has an RRAM cell that includes a top electrode, an RRAM dielectric layer, and a bottom electrode having a surface that interfaces with the RRAM dielectric layer. Oxides of the bottom electrode are substantially absent from the bottom electrode surface. The bottom electrode has a higher density in a zone adjacent the surface as compared to a bulk region of the bottom electrode. The surface has a roughness Ra of 2 nm or less. A process for forming the surface includes chemical mechanical polishing followed by hydrofluoric acid etching followed by argon ion bombardment. An array of RRAM cells formed by this process is superior in terms of narrow distribution and high separation between low and high resistance states.

20 Claims, 10 Drawing Sheets

(56) References Cited

U.S. PATENT DOCUMENTS

| | | |
|---|---|---|
| 2019/0214556 A1 | 7/2019 | Chen et al. |
| 2019/0214559 A1 | 7/2019 | Clarke et al. |

* cited by examiner

RRAM BOTTOM ELECTRODE

REFERENCE TO RELATED APPLICATION

This application claims priority to U.S. Provisional Application No. 62/752,593, filed on Oct. 30, 2018, the contents of which are hereby incorporated by reference in their entirety.

BACKGROUND

The present disclosure relates to integrated circuit devices with resistive random access memory or metal-insulator-metal capacitors, methods of making such devices, and methods of operating such devices.

Resistive random access memory (RRAM) has a simple structure, low operating voltage, high-speed, good endurance, and CMOS process compatibility. RRAM is a promising alternative to provide a downsized replacement for traditional flash memory and is finding wide application in devices such as optical disks and non-volatile memory arrays.

An RRAM cell stores data within a layer of material that can be induced to undergo a phase change. The phase change can be induced within all or part of the layer to switch between a high resistance state and a low resistance state. The resistance state can be queried and interpreted as representing either a "0" or a "1".

In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again. RRAM cells are typically formed after front-end-of line (FEOL) processing. In a typical design, an array of RRAM cells is formed between a pair of metal interconnect layers.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

RRAM cells have low resistance states (LRS) and high resistance states (HRS). LRS and HRS resistances are represented by ranges when considered over all the RRAM cells in an array, device, or wafer. Keeping these ranges narrow and widely separated reduces failure rates, improves performance, and can reduce power requirements. The present disclosure in various embodiments provides an integrated circuit device including RRAM cells having improvements in the geometry, composition, and density of that portion of the bottom electrode that is most proximate the RRAM dielectric. These improvements result in narrower LRS and HRS resistance ranges and improved separation between those ranges. The disclosure includes a manufacturing process that produces the improved RRAM cells.

Figure 1:
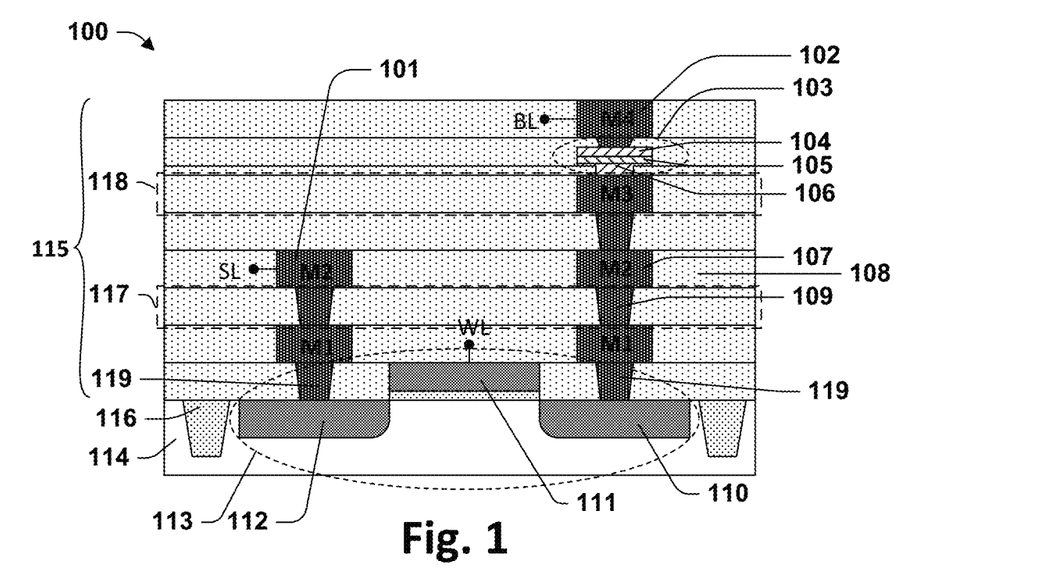
FIG. 1 provides a cross-sectional view of an integrated circuit device according to some embodiments of the present disclosure.

FIG. 1 illustrates a portion of an integrated circuit device 100 including an interconnect structure 115 formed over a substrate 114. Substrate 114 may be, for example, a bulk substrate (e.g., a bulk silicon substrate) or a silicon-on-insulator (SOI) substrate. Substrate 114 may also be a binary semiconductor substrate (e.g., GaAs), a tertiary semiconductor substrate (e.g., AlGaAs), or a higher order semiconductor substrate. Substrate 114 may contain shallow trench isolation (STI) regions 116 formed by filling trenches in substrate 114 with dielectric. Interconnect structure 115 includes a plurality of interlevel dielectric (ILD) layers 117 interleaved with metallization layers 118. ILD layers 117 may include vias 109 in a matrix of dielectric 108. Dielectric 108 may be, for example, low-κ dielectric, such as un-doped silicate glass or an oxide, such as silicon dioxide or silicon carbide. Dielectric 108 may be an extremely low-κ dielectric, which may be a low-κ dielectric with porosity that reduces the overall dielectric constant. Metallization layers 118 include metal features 107 formed in trenches within dielectric 108. Metal features 107 may include wires and vias. Metal features 107 and vias 109 may be made of a metal, such as copper or aluminum, and may be lined with dielectric-protection layers, which may be a low-κ dielectric material such as SiC. Vias 109 may form connections between metal features 107 in different metallization layers 118. Metallization layers 118 are commonly identified as M1, M2, M3, M4 and so forth in order of their stacking over substrate 114.

Integrated circuit device 100 further includes an RRAM cell 103 and a transistor 113 that is a switching device for RRAM cell 103. In the illustrated embodiment, integrated circuit device 100 has one transistor, one resistor (1T1R) architecture. In some other embodiments, the switching device is a diode and the architecture is one diode, one resistor (1D1R). In other embodiments, the switching device is a bipolar junction transistor and the architecture is one bipolar junction transistor, one resistor (1BJT1R). In still other embodiments, the switching device is a bipolar switch and the architecture is one switch, one resistor (1S1R).

Figure 2:
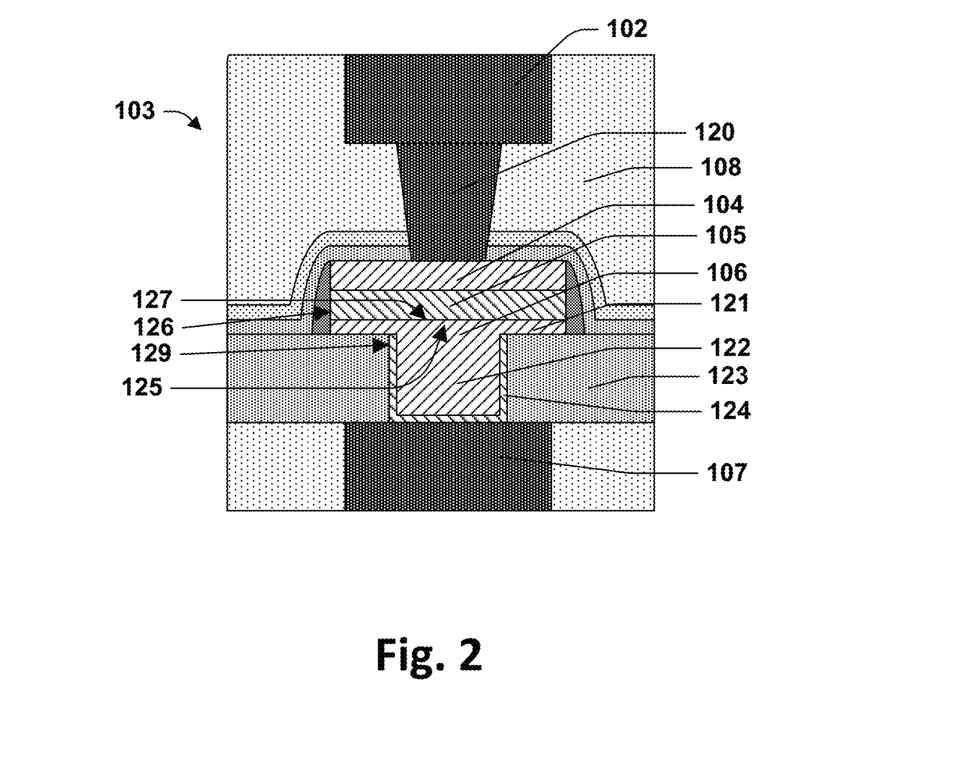
FIG. 2 provides an enlarged view of an RRAM cell in the integrated circuit device of FIG. 1.

RRAM cell 103, which is illustrated in greater detail by FIG. 2, includes a top electrode 104, an RRAM dielectric 105, and a bottom electrode 106. RRAM cell 103 is formed between the M3 and M4 metallization layers 118. Alternatively, RRAM cell 103 may be formed between another adjacent pair of metallization layers 118, such as between the M4 and M5 metallization layers 118, or elsewhere within integrated circuit device 100.

Transistor 113 may include source region 112 and drain region 110 formed in substrate 114 and gate 111 formed over substrate 114. Contacts 119 extend from a lowest of the metallization layers 118 (e.g., M1) to source region 112 and drain region 110. Contacts 119 may be made of a metal, such as copper or tungsten for example.

Bottom electrode 106 may be connected to drain region 110. A source line 101 for RRAM cell 103 may be located in one of the metallization layers 118, such as the M2 layer, and may be connected to source region 112. A bit line 102 for addressing RRAM cell 103 may be connected to top electrode 104 and located in one of the metallization layers 118 above RRAM cell 103, such as the M4 layer. A word line for addressing RRAM cell 103 may be integral with gate 111 or may be located in one of the metallization layers 118 and connected to gate 111.

As shown in FIG. 2, bottom electrode 106 may include a first portion 122 that forms a via in a dielectric layer 123, a second portion 121 that lies on top of dielectric layer 123, an interfacial region 125, which is a thin layer of bottom electrode 106 lying immediately adjacent to and forming an interface with RRAM dielectric 105. RRAM dielectric 105 is wider than first portion 122 of bottom electrode 106. The perimeter 126 or RRAM dielectric 105 lies outside the perimeter 129 of first portion 122. A via 120 connects top electrode 104 to bit line 102. Bottom electrode 106 connects to a metal feature 107 in the metallization layers 118 underneath RRAM cell 103.

Interfacial region 125 has distinctive characteristics relating to its geometry, composition, and density. Interfacial region 125 has a higher density than a bulk portion of bottom electrode 106, wherein the bulk portion is under the interfacial region 125. This higher density is limited to a narrow region near the surface 127 and may be detected with scanning transmission electron microscopy. Oxides of the material forming interfacial region 125 that would normally be present proximate the surface 127 are effectively absent. The surface 127 formed by interfacial region 125 is unusually flat. Surface 127 may have a roughness Ra of 2 nm or less, 1.5 nm for example.

The bulk composition of bottom electrode 106 is a conductive metal such as Al, Ti, Ta, Au, Pt, W, Ni, Jr, or Cu. In some embodiments, bottom electrode 106 is a metal nitride. In some embodiments, the bulk composition of bottom electrode 106 is TiN, TaN or a combination thereof. In some embodiments, bottom electrode 106 is TiN. A suitable thickness for bottom electrode 106 may be a thickness in the range from 20 Å to 200 Å. In some embodiments, the thickness of bottom electrode 106 is in the range from 50 Å to 150 Å, for example, 100 Å.

RRAM dielectric 105 may have any composition suitable for the data storage layer of an RRAM cell. A material suitable for the data storage layer of an RRAM cell is one that can be induced to undergo a reversible phase change between a high resistance state and a low resistance state. In some embodiments, the change is between an amorphous state and a metallic state. The phase change can be accompanied by or associated with a change in molecular structure. For example, an amorphous metal oxide may lose oxygen as it undergoes a phase change to a metallic state. The oxygen may be stored in a portion of RRAM dielectric 105 that remains in the amorphous state or in an adjacent layer. RRAM dielectric 105 is described as dielectric with reference the high resistance state. In the low resistance state, RRAM dielectric 105 may be a conductive material. For example, in the low resistance state, the RRAM dielectric 105 may include a high-k dielectric with one or more conductive filaments that extend from the bottom electrode to the top electrode, wherein these filaments effectively render the RRAM dielectric 105 conductive. In most embodiments, these filaments are broken in the low resistance state, such that the RRAM dielectric 105 is a high-k dielectric that fully separates the top electrode 104 and bottom electrode 106 while in the high resistance state. In some embodiments, RRAM dielectric 105 is a transitional metal oxide. Examples of materials that can be suitable for RRAM dielectric 105 include $NiO_X$, $Ta_yO_X$, $TiO_X$, $HfO_X$, $WO_X$, $ZrO_X$, $Al_yO_X$, and $SrTiO_X$. In some embodiments, RRAM dielectric 105 is a layer of material that is deposited over bottom electrode 106. A suitable thickness for RRAM dielectric 105 may be in the range from 20 Å to 170 Å. In some embodiments, the thickness of RRAM dielectric 105 is in the range from 60 Å to 140 Å, for example, 100 Å.

RRAM dielectric 105 may include a capping layer. A capping layer may provide an oxygen storage function that facilitates phase changes within RRAM dielectric 105. In some embodiments, the capping layer is a metal or a metal oxide that is relatively low in oxygen concentration. Examples of metals that can be suitable for a capping layer include Ti, Hf, Pt and Al. Examples of metal oxides that can be suitable for capping layer include $TiO_X$, $HfO_X$, $ZrO_X$, $GeO_X$, $CeO_X$. A capping layer can have any suitable thickness. A suitable thickness for a capping layer may be in the range from 20 Å to 100 Å. In some embodiments, RRAM dielectric 105 includes a capping layer 219 having a thickness in the range from 30 Å to 70 Å, for example, 50 Å.

The bulk composition of top electrode 104 may be conductive metal such as Al, Ti, Ta, Au, Pt, W, Ni, Jr, or Cu. Top electrode 104 may be a metal nitride. Top electrode 104 and bottom electrode 106 may alternatively be provided as a plurality of layers of differing materials. A suitable thickness for top electrode 104 may be in the range from 75 Å to 150 Å, for example, 100 Å.

Figure 3:
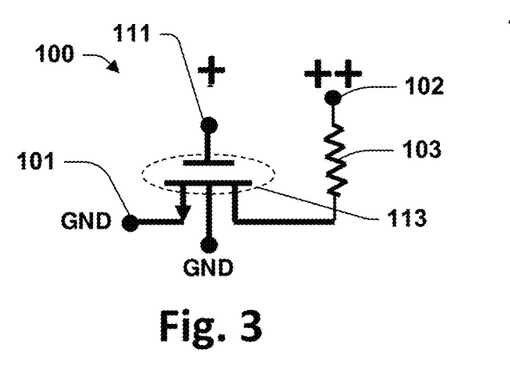
FIG. 3 is a circuit diagram illustrating a forming operation for the RRAM cell of FIG. 2.
Figure 4:
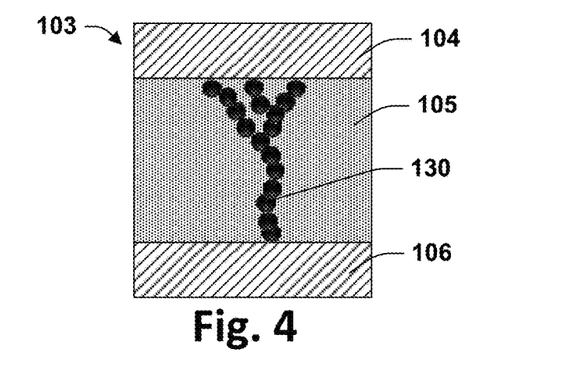
FIG. 4 illustrates a filament bridge created in the RRAM cell of FIG. 2 by the forming operation of FIG. 3.

FIGS. 3-8 illustrate the operation of RRAM cell 103 within integrated circuit device 100. FIG. 3 illustrates the application of a forming voltage to RRAM cell 103. The forming voltage may be applied only once and may be considered part of the manufacturing process for integrated circuit device 100. As illustrated in FIG. 3, the forming voltage may be a large positive voltage pulse applied to bit line 102 while source line 101 is connected to ground and transistor 113 is held open. The forming voltage causes a filament structure 130 to form in RRAM dielectric 105 as shown in FIG. 4. Filament structure 130 forms a bridge between top electrode 104 and bottom electrode 106 placing RRAM cell 103 in a low resistance state (LRS). Filament structure 130 may be composed of a reduction product of an oxide that makes up the bulk of RRAM dielectric 105.

Figure 5:
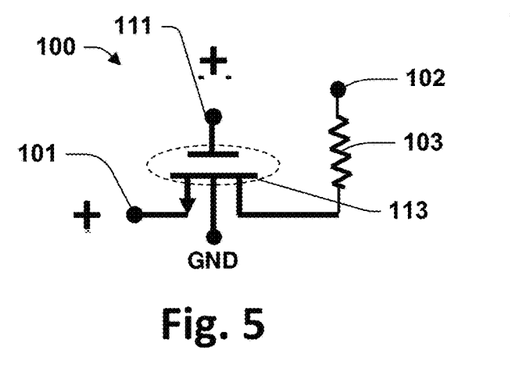
FIG. 5 is a circuit diagram illustrating a reset operation for the RRAM cell of FIG. 2.
Figure 6:
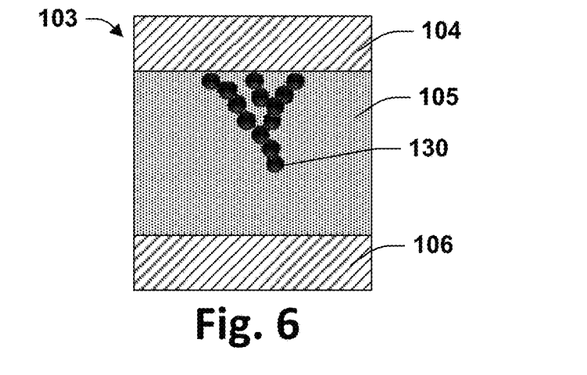
FIG. 6 illustrates a filament bridge in the RRAM cell of FIG. 2 disrupted by the reset operation of FIG. 5.

FIG. 5 illustrates a reset operation for RRAM cell 103. The reset is accomplished with a reverse pulse, which may be generated by applying a positive voltage pulse to source line 101 while bit line 102 is grounded and transistor 113 is held open. As shown in FIG. 6, the reset operation unmakes a portion of filament structure 130, whereby filament structure 130 no longer forms a bridge between top electrode 104 and bottom electrode 106. The reset operation greatly increase the resistance of RRAM cell 103 and places RRAM cell 103 in a high resistance state (HRS).

Figure 7:
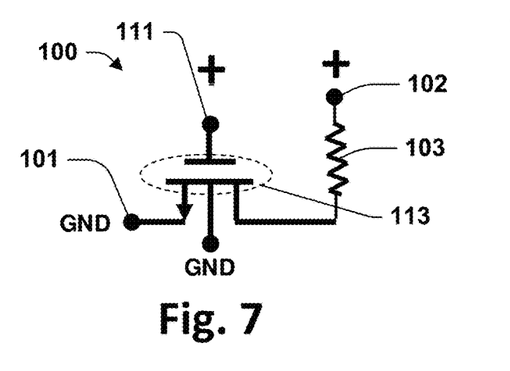
FIG. 7 is a circuit diagram illustrating a set operation for the RRAM cell of FIG. 2.
Figure 8:
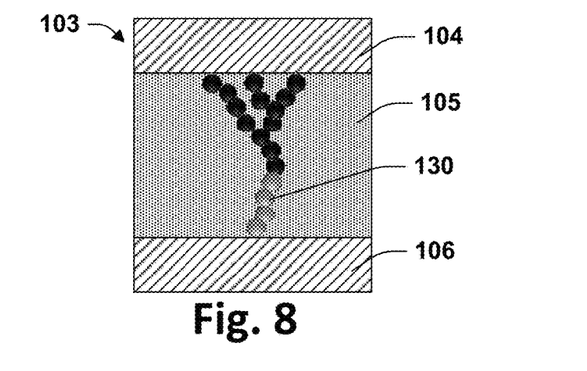
FIG. 8 illustrates a filament bridge reformed in the RRAM cell of FIG. 2 by the set operation of FIG. 7.

FIG. 7 illustrates a set operation for RRAM cell 103. The set operation may be similar to the forming operation except that it involves a lower voltage pulse. As shown in FIG. 8, the lower voltage pulse restores that portion of filament structure 130 that was unmade by the reset operation and returns RRAM cell 103 to the LRS. The set and reset operations may be performed many times over the operating life of integrated circuit device 100.

With reference to FIG. 2, in some embodiments, RRAM cell 103 is structured whereby filament structure 130 forms inward from the perimeter 126 of RRAM cell 103. The filament structure 130 is formed far enough inward from perimeter 126 that any damage or contamination at the perimeter 126 of RRAM dielectric 105 that may have been introduced during processing to form integrated circuit device 100 does not affect filament structure 130. In some embodiments, the structure of RRAM cell 103 prevents filament structure 130 from forming within a distance of 20 Angstroms of perimeter 126, whereby damage or contamination associated with perimeter 126 does not affect filament structure 130. A structure for RRAM cell 103 that serves this purpose is one in which second portion 121 of RRAM cell 103, the portion that lies on top of dielectric layer 123, is thin to the extent that its resistance to outwardly flowing current prevents formation of filament structure 130 near perimeter 126. Other structures that serve this purpose include, without limitation, those that make the distance between top electrode 104 and bottom electrode 106 greater near perimeter 126 than it is at points inward from perimeter 126. Such a structure may be obtained using an extra layer of dielectric that is formed over bottom electrode 106 before depositing RRAM layer 105. The extra layer of dielectric covers portions of bottom electrode 106 that are near perimeter 126, but does not cover portions of bottom electrode 106 that are spaced inwardly from perimeter 126.

Figure 9:
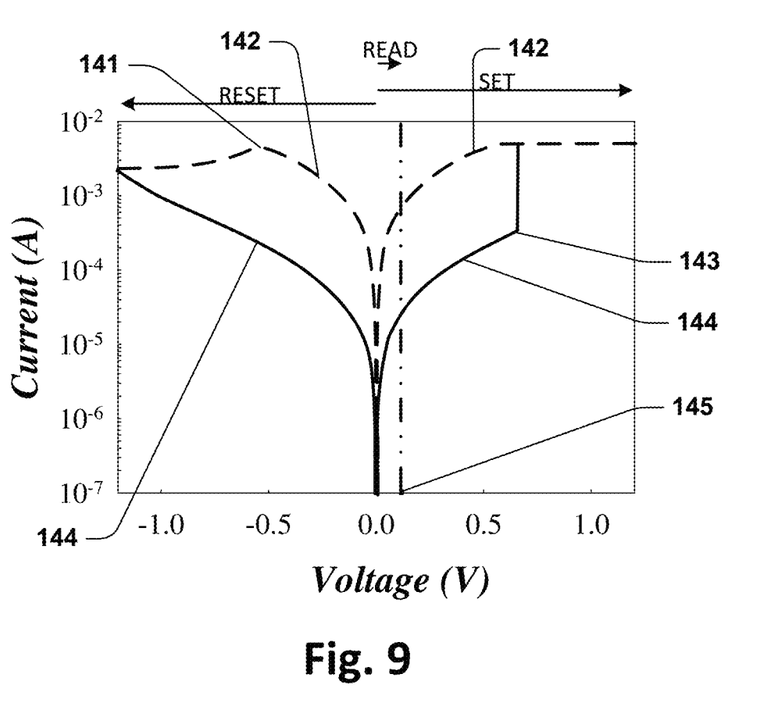
FIG. 9 is a plot of current magnitude in relation to voltage applied to the RRAM cell of FIG. 2.

FIG. 9 illustrates the operation for RRAM cell 103 with a plot of current versus voltage. Because of the hysteresis effect of set and reset operations, the plot is bimodal having an upper current curve 142 representing the LRS and a lower current curve 144 representing the HRS. Under the application of a small voltage, such as read voltage 145, the current response will follow upper current curve 142 if RRAM cell 103 is in the LRS and lower current curve 144 if RRAM cell 103 is in the HRS. If RRAM cell 103 is in the HRS, raising the voltage to point 143 initiates a transition from lower current curve 144 to upper current curve 142, which is the set operation. If RRAM cell 103 is in the LRS, lowering the voltage to point 141 initiates a transition from upper current curve 142 to lower current curve 144. The distinctive characteristics of interfacial region 125 are conducive to creating a large separation between upper current curve 142 and lower current curve 144 at read voltage 145 and to making that separation consistent among a large number of RRAM cells 103 in integrated circuit device 100.

FIGS. 10-18 and 22-25 illustrate integrated circuit device 100 at various stages of manufacture. Although FIGS. 10-18 and 22-25 are described in relation to a series of acts, it will be appreciated that the order of the acts may in some cases be altered and that this series of acts are applicable to structures other than the ones illustrated. In some embodiments, some of these acts may be omitted in whole or in part.

Figure 10:
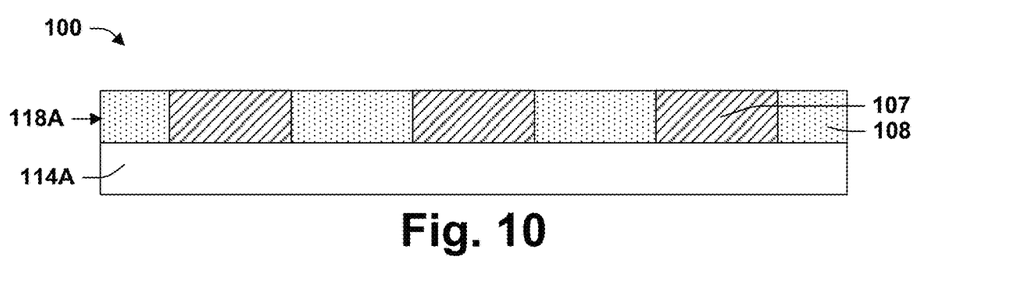
FIGS. 10 through 18 provide cross-sectional views illustrating stages in a process that may be used to manufacture the integrated circuit device of FIG. 1.

FIG. 10 illustrates integrated circuit device 100 at a stage of back-end-of-line (BEOL) processing following the formation of a metallization layer 118A. Metallization layer 118A is the M3 layer, but could alternatively be the M4 layer or some other metallization layer 118. Metallization layer 118A is formed over substrate 114A, which represents substrate 114 plus any additional metallization layers 118 formed prior to metallization layer 118A. At this stage of processing, substrate 114 may be part of a semiconductor wafer. The semiconductor wafer may be of any suitable diameter, for example, 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"). At a later stage of processing the wafer may be singulated into individual dies that correspond to individual integrated circuit devices 100.

Figure 11:
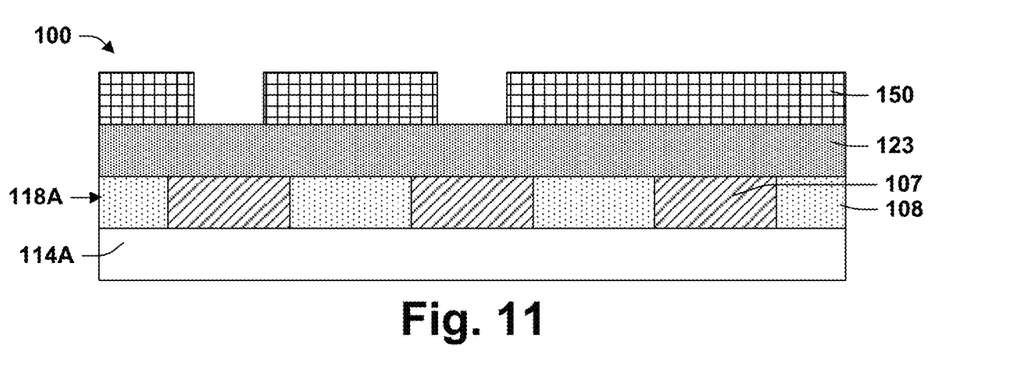

As illustrated by FIG. 11, dielectric layer 123 is formed over metallization layer 118A followed by a mask 150 for patterning dielectric layer 123. In some embodiments, dielectric layer 123 is SiC. Mask 150 may be formed using photolithography. A mask formed using lithography may be a photoresist mask but may also be a hard mask such as a nitride hard mask that is patterned using a photoresist mask.

Figure 12:
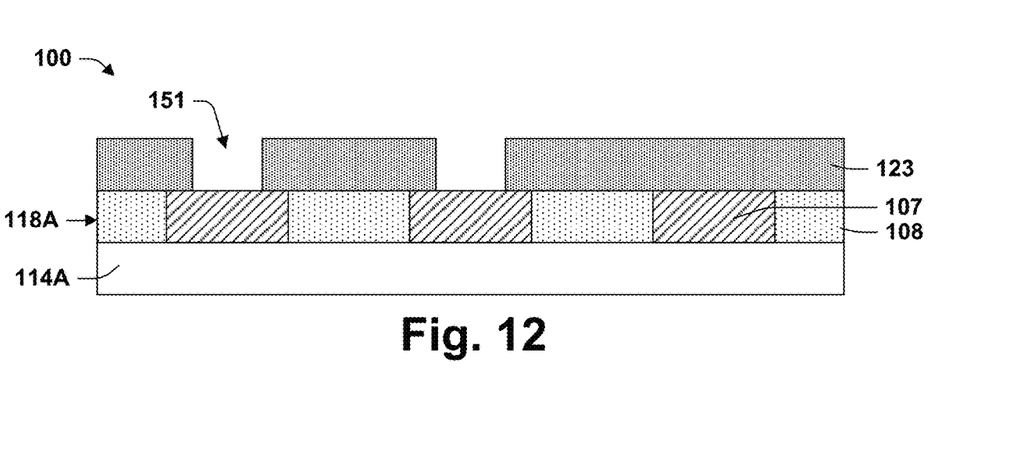

FIG. 12 illustrates integrated circuit device 100 after mask 150 has been used to form openings 151 in dielectric layer 123 then stripped away. Opening 151 are formed by etching areas of dielectric layer 123 that are left exposed by mask 150. Openings 151 expose certain metal features 107 in metallization layer 118A.

Figure 13:
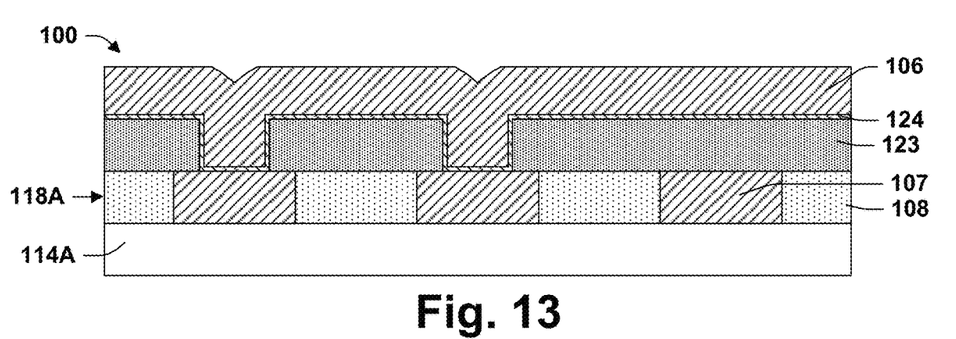

FIG. 13 illustrates integrated circuit device 100 after deposition of barrier layer 124 and a first portion of bottom electrode 106. Metal features 107 may be copper and bottom electrode 106 may be a material that is protected from copper diffusion. Accordingly, barrier layer 124 may be a diffusion barrier layer. A diffusion barrier layer may be, for example, TiN.

Figure 14:
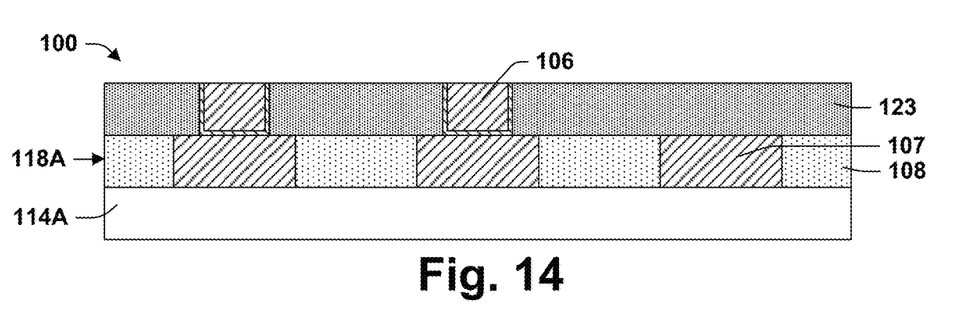
Figure 15:
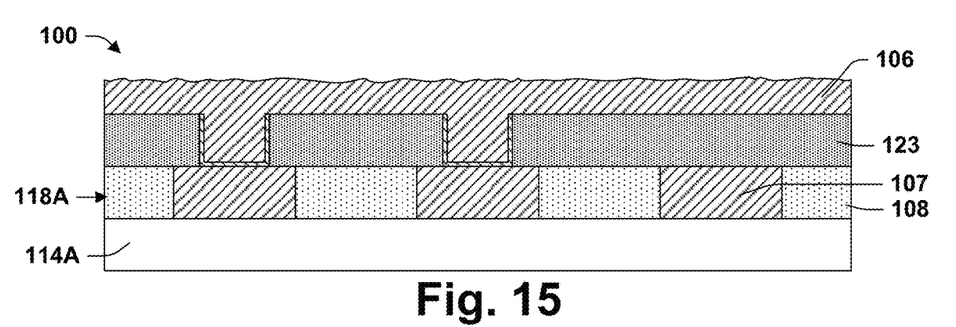

FIG. 14 illustrates integrated circuit device 100 after chemical-mechanical planarization (CMP), which removes that portion of bottom electrode 106 that lies outside openings 151 (see FIG. 12) in dielectric layer 123. CMP generally planarizes an upper surface 127 of bottom electrode 106, however, at this point in processing the fill of openings 151 may be imperfect. Moreover, it is desirable to form bottom electrode 106 to include a thin layer of material over dielectric layer 123. A thin layer may be in the range from 50A to 200A. For these reasons, an additional thickness of bottom electrode 106 may be deposited as shown in FIG. 15. The uniformity of upper surface 127 of bottom electrode 106 is greater after this second deposition as compared to after the first.

Figure 16:
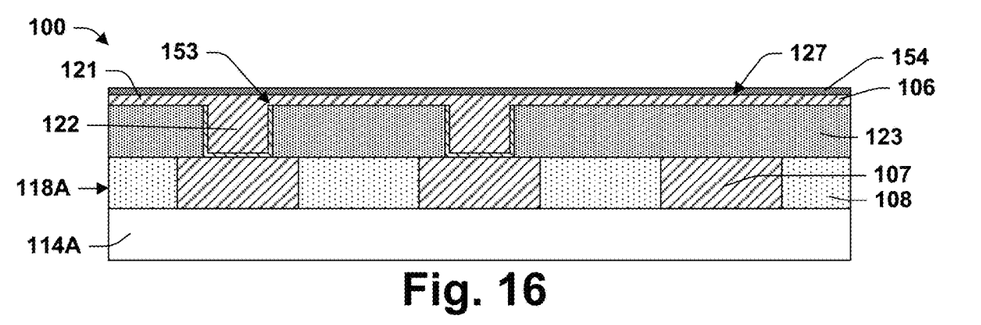

FIG. 16 shows the result of a second CMP operation. This second CMP recesses bottom electrode 106 but leaves a first portion 122 that forms a via in a dielectric layer 123 and a second portion 121 that lies on top of dielectric layer 123. In some embodiments, processing produces a chemically and physically uniform upper surface 127 that promotes consistency among RRAM cells 103. Leaving second portion 121 on top of dielectric layer 123 may improve this consistency. One way in which consistency is improved is by covering the area 153 where a material such as that of barrier layer 124 lying adjacent to and having a different wear rate than the material of bottom electrode 106 could result in a geometric non-uniformity. Another way that leaving second portion 121 on top of dielectric layer 123 may facilitate improve consistency is that second portion 121 covers interfaces in the area 153 that could etch non-uniformly or become repositories of contaminants.

Figure 19:
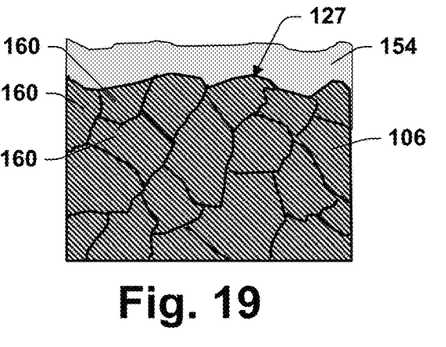
FIGS. 19 through 21 illustrate the effect on a bottom electrode surface of stages in a process that may be used to manufacture the integrated circuit device of FIG. 1.

FIG. 16 illustrates in an exaggerated manner a residue 154 left on upper surface 127 of bottom electrode 106. Residue 154 includes oxidation products of the material forming bottom electrode 106. This residue 154 is also shown in FIG. 19, which schematically illustrates upper surface 127 at a resolution at which individual grains 160 of bottom electrode 106 are visible.

Figure 17:
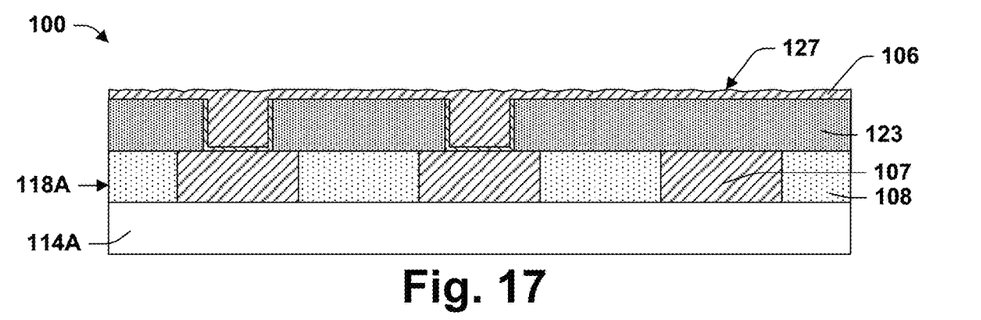
Figure 20:
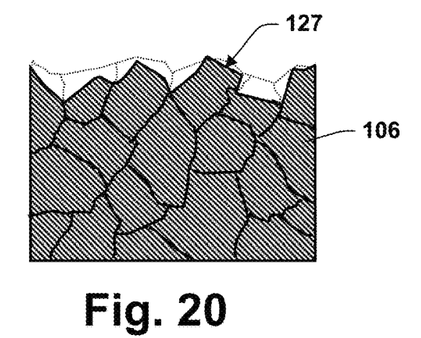

FIGS. 17 and 20 illustrate the result of removing residue 154 by wet etching, with hydrofluoric acid (HF) for example. Wet etching is effective for removing residue 154, but as shown in FIG. 20, the wet etch chemical preferentially attacks bottom electrode 106 along boundaries between grains 160, which results in wet etching increasing the roughness of upper surface 127. It has been found that the benefits of removing residue 154 through wet etching at this stage of processing outweigh this disadvantage in terms of the overall effect on uniformity and LRS to HRS separation in an array of RRAM cells 103.

Figure 18:
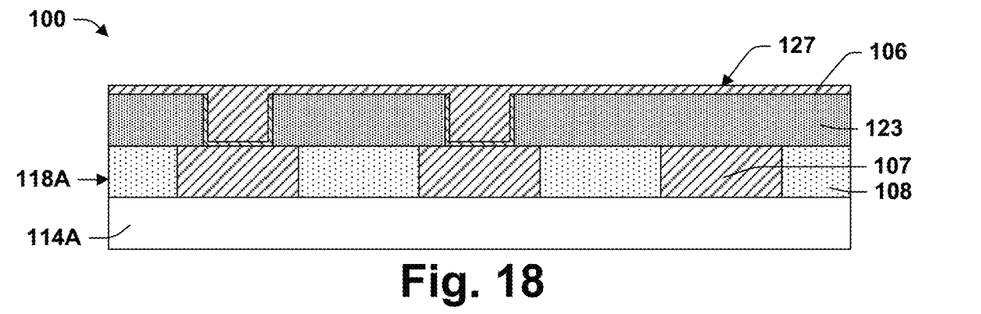
Figure 21:
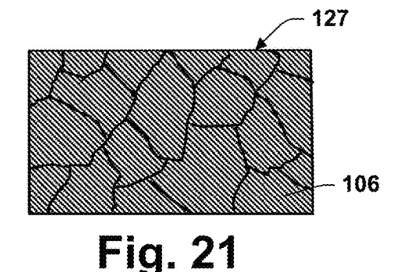

FIGS. 18 and 21 illustrate the result of flattening upper surface 127 using ion bombardment after wet etching and prior to any significant oxide formation on upper surface 127. Ion bombardment causes a restructuring of bottom electrode 106 in a region 125 proximate upper surface 127 that results in an increase in density for that region as compared to a bulk of bottom electrode 106. The restructuring may include reshaping individual grains 160 and reducing the volume of interstices between grains 160. Ion bombardment also flattens upper surface 127, reducing its roughness to even less than the roughness prior to wet etching. Wet etching tends to increase the roughness of surface 127. Thus, prior to wet etching (e.g., FIG. 19), residue may be present over individual grains 160 of the bottom electrode 106. After wet etching (e.g., FIG. 20), the roughness Ra of the upper surface 127 of the grains 160 may be in the range from about 5 nm to about 8 nm. After ion bombardment (e.g., FIG. 21), the roughness of surface 127 of the grains 160 may be reduced to a roughness Ra of 2 nm or less, 1.5 nm for example.

Figure 22:
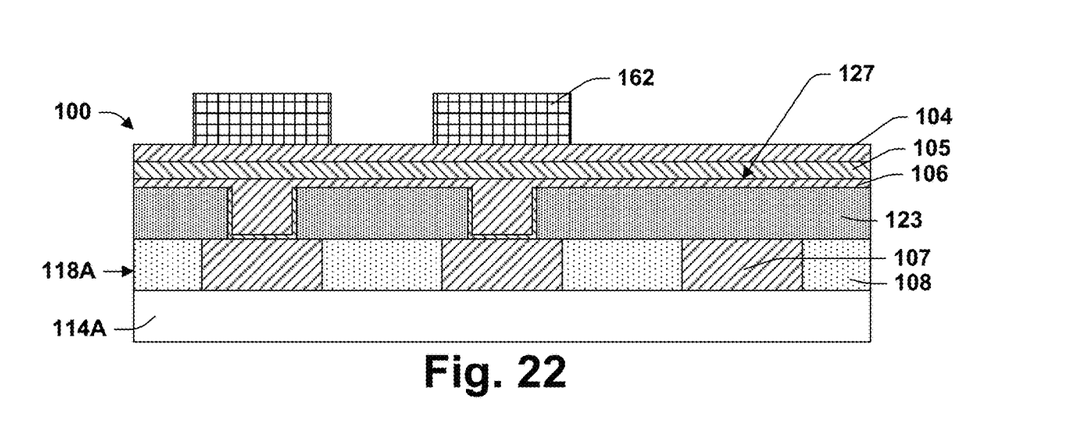
FIGS. 22 through 25 provide cross-sectional views illustrating additional stages in a process that may be used to manufacture the integrated circuit device of FIG. 1.

FIG. 22 illustrates integrated circuit device 100 after forming RRAM dielectric 105, top electrode 104, and an RRAM cell patterning mask 162 over bottom electrode 106. In some embodiments, RRAM dielectric 105 is formed by depositing material over bottom electrode 106. Forming any of these layers may involve depositing a plurality of layers of differing materials.

Figure 23:
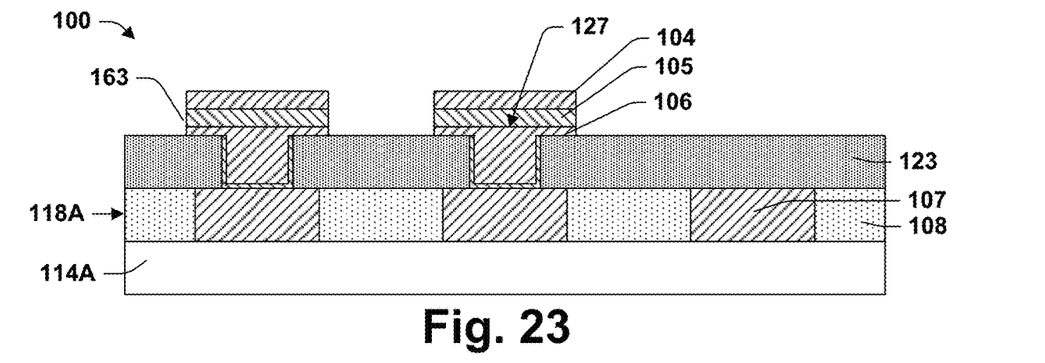
Figure 24:
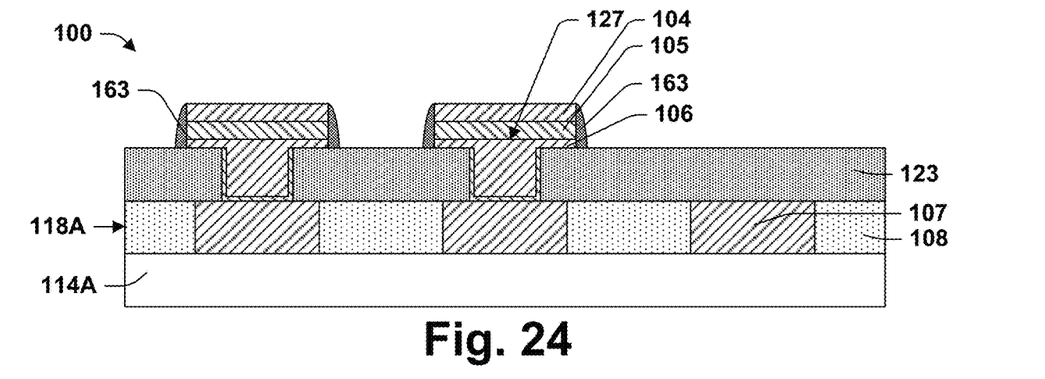

FIG. 23 illustrates integrated circuit device 100 after patterning RRAM cells 103 using mask 162 and then stripping mask 162. Spacers 163 as shown in FIG. 24 may then be formed on the periphery of RRAM cells 103. Spacers 163 may be any suitable material or combination of materials. For example, spacers 163 may be silicon nitride.

Figure 25:
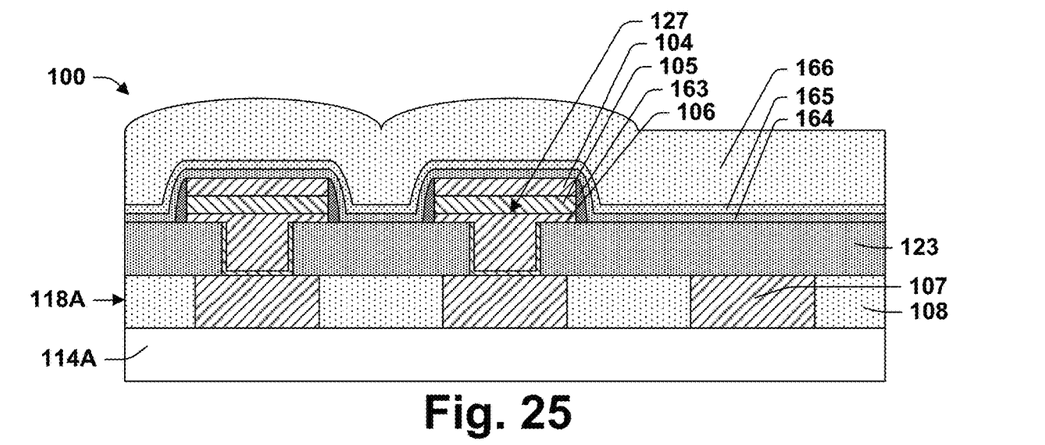

FIG. 25 illustrates integrated circuit device 100 after formation of dielectric layers 164, 165, and 166. Dielectric layer 164 may be a silicon carbide layer. Dielectric layer 165 may be a silicon dioxide layer, and may be a silicon dioxide layer derived from tetraethyl orthosilicate (TEOS). Dielectric layer 166 may be an extremely low-K dielectric. Dielectric layers 164, 165, and 166 may be patterned in a damascene or dual damascene process to form the structure illustrated by FIG. 2.

Figure 26:
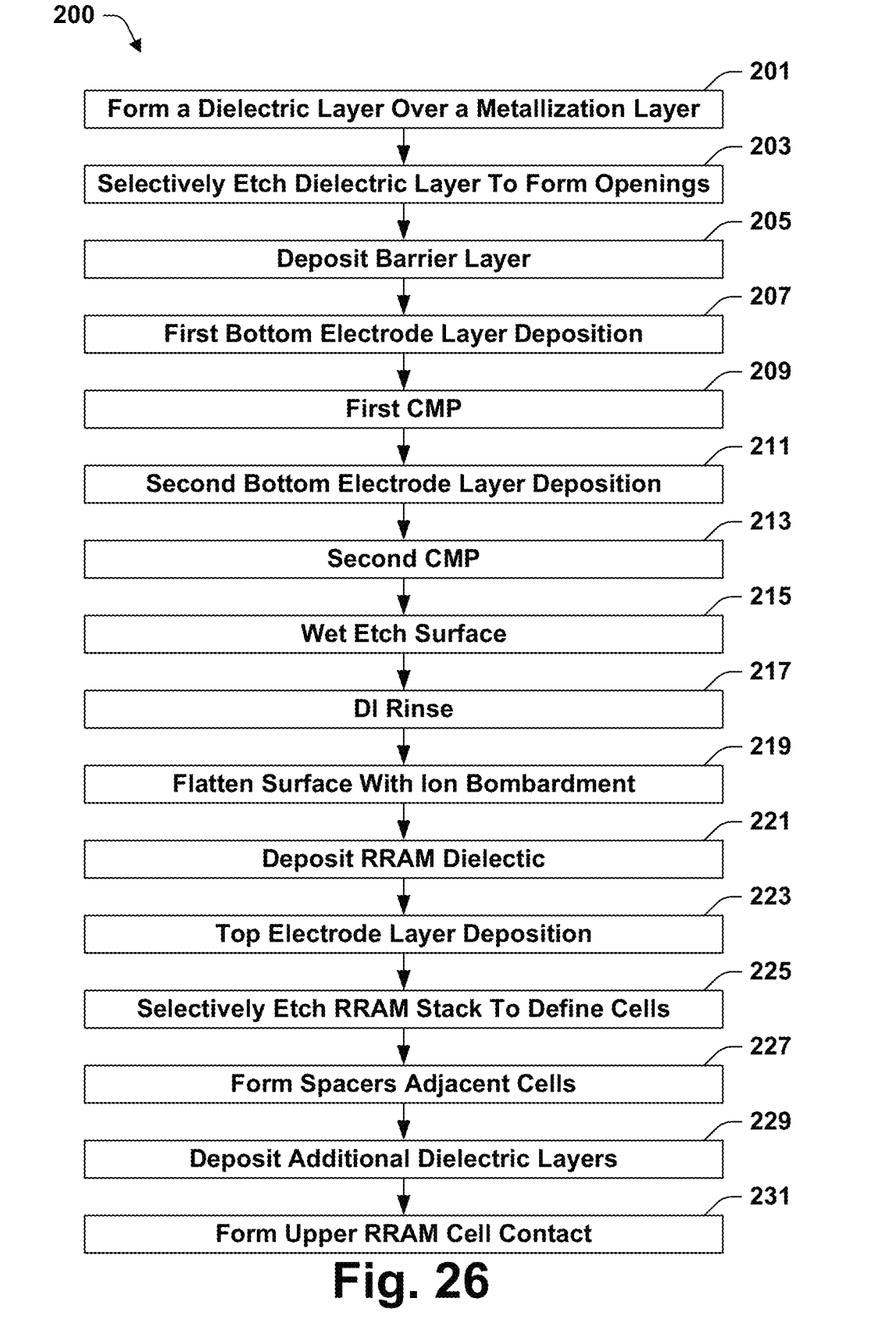
FIG. 26 is a flow chart of a method according to some embodiments of the present disclosure.

FIG. 26 is a flow chart of a method 200 according to some aspects of the present teachings. Method 200 may be used to form the integrated circuit device 100. Method 200 begins with act 201 forming dielectric layer 123 over a metallization layer 118A. By this sequencing, RRAM cell 103 will be formed within an ILD layer 117. But RRAM cell 103 may also be formed elsewhere within an integrated circuit device 100. The metallization layer 118A may be the M3 layer, the M4 layer, or any other metallization layer 118A formed over substrate 100 during back-end-of-line (BEOL) processing. Dielectric layer 123 may be, for example, SiC.

Method 200 continues with act 203, selectively etching dielectric layer 123 to form openings 151 for example as illustrated by FIG. 12. Selective etching may begin with forming a mask 150 that defines the etch pattern. Mask 150 may be formed using standard photolithographic methods, such as depositing a photoresist, selectively exposing a portion of the photoresist according to the desired patterning, and developing the photoresist to form the mask 150. Etching may be plasma etching. After etching the mask 150 is stripped.

Method 200 continues with act 205, depositing barrier layer 124. Barrier layer 124 covers exposed metal features 107 in the metallization layer 118A. This action is optional but desirable for embodiments in which metal features 107 are copper or otherwise unsuitable for direct contact with the material of bottom electrode 106. Barrier layer 124 may be, for example, TaN.

Method 200 continues with act 207, depositing a first layer of bottom electrode 106. That material may be deposited, for example, with physical vapor deposition. Any material suitable for bottom electrode 106 may be used. That material may be, for example, TiN. The material may deposit somewhat unevenly as shown for example in FIG. 13 due in part to the unevenness of the surface on which that material deposits.

Method 200 continues with act 209, chemical-mechanical planarization (CMP). CMP is carried out with a chemically reactive slurry, which is typically applied to a wafer surface using a polishing pad. The CMP of act 209 may stop on barrier layer 124, in which case the remaining material that was deposited in act 207 may be restricted to openings in barrier layer 124 as shown in FIG. 14, for example.

Method 200 continues with act 211, depositing a second layer of bottom electrode 106. That material may be the same material used to deposit the first layer of bottom electrode 106, or a different material. In some embodiments, the material is the same. The surface produced by this second deposition is more uniform than that produced by the deposition of act 207 but may still be comparatively rough as shown in FIG. 15, for example.

Method 200 continues with act 213, which is a second CMP operation. The second CMP operation may stop short of barrier layer 124 as shown in FIG. 16, for example. The material of bottom electrode 106 may be deposited with one deposition followed by one CMP operation, but carrying out this process in two stages may have advantages such as providing better fill of the openings in barrier layer 124 and better control of the thickness of bottom electrode 106 that overlies barrier layer 124.

For example, as shown in FIGS. 16 and 19, CMP leaves a residue 154 on the surface of bottom electrode 106. Residue 154 includes oxides of the material forming bottom electrode 106. FIGS. 16 and 19 greatly exaggerate the amount of oxide on the surface 127. It has been found, however, that removing this oxide has an unexpected beneficial impact on the LHS and RHS distribution and separation within an array of RRAM cells 103 within integrated circuit device 100.

Method 200 continues with act 215, which is a wet etch. In some embodiments, this wet etch is with hydrofluoric acid (HF). The wet etch may involve dipping a wafer in an HF solution. As shown in FIGS. 17 and 20, for example, wet etching removes residue 154. Simultaneously, wet etching may increase the roughness of surface 127 due to selective etching of bottom electrode 106 along grain boundaries.

Method 200 continues with act 217, which is a rinse operation. The rinse operation may be a deionized water rinse. Rinsing removes residues of chemicals used in the wet etch operation.

Method 200 continues with act 219, which is ion bombardment. Any suitable ions may be used. In some embodiments, the ions are inert gas ions. In some embodiments, ion bombardment is with argon ions (Ar$^+$). The bombardment is carried out at an energy level at which the argon ions flatten surface 127. While flattening the surface 127, ion bombardment may also increase the density of bottom electrode 106 in a region 125 immediately adjacent surface 127. Ion bombardment may flatten surface 127 to a roughness Ra of 2 nm or less, 1.5 nm for example.

The outcome of ion bombardment is improved if the ion bombardment is preceded by the hydrofluoric acid etching. The improvement may be related to the removal of oxides from surface 127. Accordingly, it is desirable to carry out act 219 before native oxides have formed on surface 127. Etching with hydrofluoric acid passivates surface 127, which allows that surface to be exposed to the atmosphere for a limited period of time without native oxide forming to a significant degree. In some embodiments, ion bombardment is performed within 1 hour of wet etching to avoid significant native oxide formation. In some embodiments, ion bombardment is performed 10 minutes or less after wet etching.

Method 200 continues with act 221, depositing RRAM dielectric 105 over surface 127. In some embodiments, RRAM dielectric 105 is deposited without oxidizing the surface 127 of bottom electrode 106. RRAM dielectric 105 may be formed by physical or chemical vapor deposition, for example.

Method 200 continues with act 223, forming top electrode 104 over RRAM dielectric 105. Top electrode layer 104 may be any suitable conductive material or combination of materials and may be formed by any suitable method. Examples of potentially suitable materials include titanium nitride or tantalum nitride. A suitable process may be physical vapor deposition.

Method 200 continues with act 225, selectively etching the RRAM cell stack, which may include bottom electrode 106, RRAM dielectric 105, and top electrode 104 to define RRAM cells 103. Selectively etching the RRAM cell stack may include forming a mask 162 over top electrode 104 as shown in FIG. 22 for example. Mask 162 may be a photoresist mask and/or a hard mask formed with photolithography. The etching may include plasma etching. Dielectric layer 123 may provide an etch stop. Mask 162 may be stripped after etching is complete as shown in FIG. 23 for example.

Method 200 continues with act 227, forming spacers 163 on the sides of RRAM cells 103 as shown, for example, in FIG. 24. Spacers 163 may be made of any suitable material and may be formed by any suitable method. A suitable material may be silicon nitride (SiN), for example. A suitable process may include depositing the SiN over RRAM cells 103 and plasma etching to remove the SiN except where it forms spacers 163.

Method 200 continues with act 229, which is depositing one or more additional dielectric layers to encapsulate and insulate RRAM cells 103 as shown in FIG. 25, for example. The dielectric layers may include, for example, a silicon carbide dielectric layer 164, silicon dioxide dielectric layer 165, and an extremely low-κ dielectric layer 166. These layers may be formed by any suitable method. For example, silicon dioxide dielectric layer 165 may be formed by depositing tetraethyl orthosilicate (TEOS).

Method 200 continues with act 231, which forms an upper contact for RRAM cell 103. Act 231 includes forming an opening through dielectric layers 164, 165, and 166 to expose top electrode 104 and filling that opening with conductive material to create a via 120. Act 231 may include completing the ILD layer 117 that contains RRAM cells 103. Act 231 may also include forming the metallization layer 118 that lies above RRAM cells 103. Act 231 may include a damascene of dual damascene process to produce a structure like the one illustrated in FIG. 2.

Figure 27:
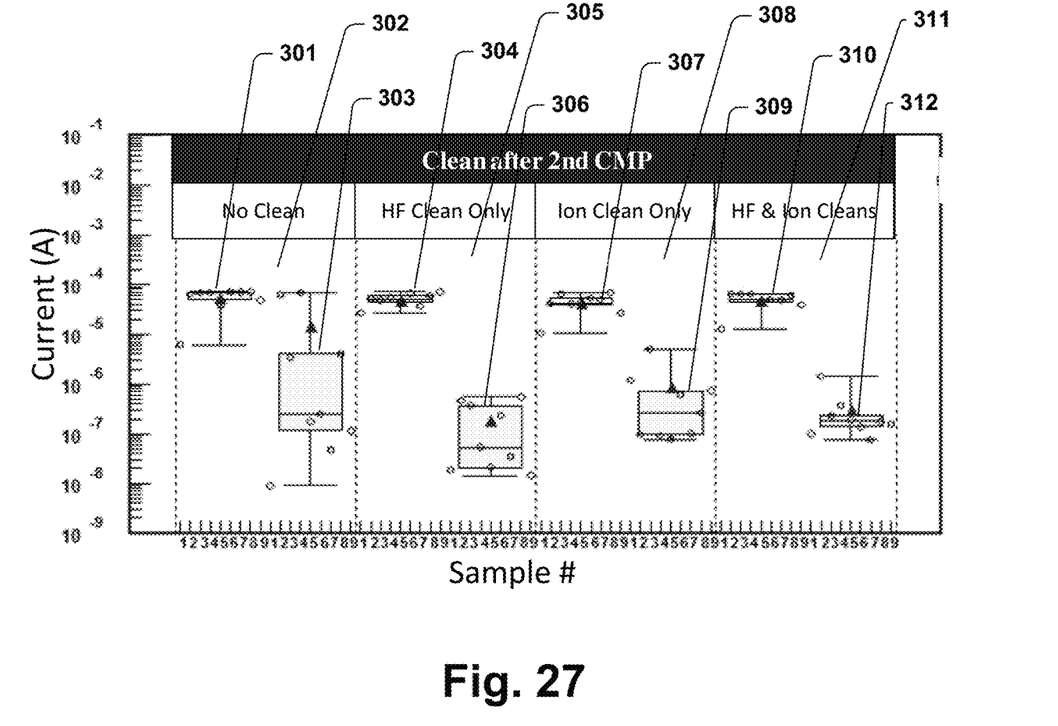
FIG. 27 is a chart of resistance data showing the variation and spread of resistances for high and low resistance states among samples for each of four processing regimes.

Method 200 include treatments of surface 127 of bottom electrode 106 that are carried out prior to forming RRAM dielectric 105. These surface treatments include wet etching and ion bombardment. Wet etching may be with an acid solution such as a hydrofluoric acid solution, or the like. Ion bombardment may be with heavy ions, such as argon ions or the like. FIG. 27 shows the effects of these surface treatments on LRS and HRS ranges. The vertical axis is current. The horizontal axis corresponds to various samples. Samples in the first data set 302 are for RRAM cells 103 prepared without either surface treatment. The values on the left in first data set 302 are measurements of the low resistance state for each of nine samples. The values on the right in first data set 302 are measurements of the high resistance state for each of those same nine samples. The rectangles show ranges of values within one standard deviation of the mean. Rectangle 301 illustrates the LRS range for the samples in data set 302. The rectangle 303 illustrates the HRS range for those same samples.

First data set 302 data set provides a baseline. The second data set 305 shows the effect of applying the wet etch. The wet etch improves the LRS and HRS range separation, as illustrated by rectangles 304 and 306, but the HRS range remains rather large. The third data set 308 shows the effect of applying the ion bombardment without the wet etch. As illustrated by rectangles 307 and 309, third data set 308 shows moderate improvements in LRS and HRS ranges, widths, and separation as compared to the baseline. The fourth data set 311 shows the effect of a process according to the present disclosure, which includes both surface treatments. As illustrated by rectangles 310 and 312, fourth data set 311 shows a significant improvement in LRS and HRS range widths and separation as compared to any of the other data sets.

Taking ratios between currents one standard deviation below the mean for the low resistance states and one standard deviation above the mean for the high resistance states gives high resistance to low resistance ratios of about 13 for the first data set 302, about 120 for the second data set 305, about 38 for the third data set 308, and about 250 for the fourth data set 311. Only the devices obtained using both surface treatments provided a high resistance state to low resistance state ratio greater than 200 at a standard measurement voltage.

Some aspects of the present teachings relate to an integrated circuit device having an RRAM cell formed over a substrate. The RRAM cell includes a top electrode, an RRAM dielectric layer, and a bottom electrode having a surface that interfaces with the RRAM dielectric layer. In some embodiment, oxides of the bottom electrode are substantially absent from the bottom electrode at the surface. In some embodiments, the bottom electrode has a higher density in a zone adjacent the surface as compared to a bulk region of the bottom electrode. In some embodiments the surface has a roughness Ra of 2 nm or less. The surface may have all these characteristics. A bottom electrode having these characteristics at a surface through which it interfaces the RRAM dielectric layer provides narrow and well separated LRS and HRS ranges.

Some aspects of the present teachings relate to an integrated circuit device having an RRAM cell formed over a substrate. The RRAM cell includes a top electrode, an RRAM dielectric layer, and a bottom electrode having a surface that interfaces with the RRAM dielectric layer. The surface is the product of a process that includes chemical mechanical polishing of the bottom electrode to produce a surface on which oxide is present, wet etching to remove the oxide, and ion bombardment to flatten the surface. This process may result in oxides of the bottom electrode being substantially absent at the surface, the bottom electrode may have a higher density in a zone adjacent the surface as compared to a bulk region of the bottom electrode, and the surface may have a roughness Ra of 2 nm or less.

In some embodiments, a first portion of the bottom electrode forms a via in a dielectric layer; a second portion of the bottom electrode is atop the via, and the surface is on the second portion. In some embodiments, a first portion of the bottom electrode forms a via in a dielectric layer, a second portion of the bottom electrode is wider than the via, and the surface is on the second portion. These embodiments have structures in which interfaces between the dielectric layer and bottom electrode are recessed from the surface, which may improved the uniformity of the surface.

Some aspect of the present teachings relate to a method of manufacturing an integrated circuit device. The method includes providing a semiconductor substrate, forming a metallization layer over the semiconductor substrate, forming a bottom electrode of conductive material over the metallization layer, performing a chemical-mechanical planarization (CMP) on an upper surface of the bottom electrode, after the CMP, performing a wet etch to remove an oxide or residue left from the CMP operation, performing an ion bombardment on the surface cleaned by the wet etch, forming a metal oxide layer on the surface flattened with ion bombardment, and forming a top electrode of conductive material over the metal oxide layer. An RRAM cell array in an integrated circuit device produced according to this method may be characterized by narrow and well separated LRS and HRS ranges.

In some embodiments, the CMP leaves the oxide on the upper surface and the wet etch removes the oxide. In some embodiments, ion bombardment takes place before native oxide forms on the surface treated by the wet etch. In some embodiments, CMP leaves the surface with a first roughness and the wet etch brings the surface to a second roughness, which is greater than the first roughness. In some embodiments ion bombardment brings the upper surface to a third roughness, which is less than the second roughness. These embodiment reflect the discovery that removing the oxide from the surface by hydrofluoric acid etching prior to argon ion bombardment unexpectedly produces a superior result even if the hydrofluoric acid significantly increases surface roughness.

In some embodiments, the metal oxide layer of the RRAM cell is formed by depositing metal oxide over the bottom electrode. This approach to forming the metal oxide layer preserves qualities of the surface that may be altered if the metal oxide layer is formed by an alternative method such as rapid thermal oxidation of an upper portion of the bottom electrode.

In some embodiments, the method further includes forming a dielectric layer over the substrate and selectively forming openings in the dielectric layer. In some of these embodiments, forming the bottom electrode comprises depositing the conductive material within one of the openings in the dielectric layer and also above dielectric layer as a result of which the bottom electrode interfaces with the metal oxide layer above the opening. In some of these embodiments, forming the bottom electrode includes depositing material within and above an opening in the dielectric layer. After further processing, the dielectric layer has edges aligned to the edges of the RRAM cell, and the edges of the dielectric layer aligned to the edges of the RRAM cell are outside the opening. In some embodiments, the opening in the dielectric layer has a maximum width and the RRAM dielectric layer within the RRAM cell has a width that is greater than the maximum width of the opening.

Some aspects of the present teachings relate to a method that includes providing a semiconductor substrate, forming a back-end-of-line (BEOL) interconnect structure over the semiconductor substrate, the BEOL interconnect structure including a plurality of metal features within a dielectric structure, forming a bottom electrode of conductive material over a metal feature of the BEOL interconnect structure, wherein an upper surface of the bottom electrode has a first surface roughness, performing a chemical-mechanical planarization (CMP) on the upper surface of the bottom electrode to provide a planarized upper surface, wherein the planarized upper surface has a second surface roughness that is less than the first surface roughness and wherein an oxide is formed on the planarized upper surface, performing a wet etch to remove the oxide, thereby exposing an upper surface of the conductive material of the bottom electrode, the exposed upper surface of the conductive material having a third surface roughness that is greater than the second surface roughness, and performing an ion bombardment on the exposed upper surface of the conductive material of the bottom electrode, thereby reducing the third surface roughness to a fourth surface roughness.

Some aspects of the present teachings relate to an integrated circuit device having an RRAM cell formed over a substrate. The RRAM cell includes a top electrode, an RRAM dielectric layer, and a bottom electrode layer. A bulk of the bottom electrode is a first metal. A bulk of the RRAM dielectric layer is a metal oxide. The metal oxide is an oxide of a metal distinct from the first metal. The bottom electrode and the RRAM dielectric layer have an interface at which the first metal contacts the metal oxide.

Some aspects of the present teachings relate to an integrated circuit device having an RRAM cell formed over a substrate. The RRAM cell includes a top electrode, an RRAM dielectric layer, and a bottom electrode layer. The bottom electrode and the RRAM dielectric layer have an interface. A material forming the bottom electrode has a higher density in a zone adjacent the interface as compared to a bulk region of the bottom electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a semiconductor substrate;
forming a metallization layer over the semiconductor substrate;
forming a bottom electrode of conductive material over the metallization layer;
performing a chemical-mechanical planarization (CMP) on an upper surface of the bottom electrode;
after the CMP, performing a wet etch to remove an oxide or residue from the upper surface;
after the wet etch, performing an ion bombardment on the upper surface;
after the ion bombardment, forming a metal oxide layer on the bottom electrode; and
forming a top electrode of conductive material over the metal oxide layer.

2. The method of claim 1, wherein the CMP leaves the oxide on the upper surface and the wet etch removes the oxide.

3. The method of claim 1, wherein the ion bombardment takes place before native oxide forms on the upper surface treated by the wet etch.

4. The method of claim 1, wherein:
the CMP leaves the upper surface with a first roughness; and
the wet etch brings the upper surface to a second roughness, which is greater than the first roughness.

5. The method of claim 4, wherein:
the ion bombardment brings the upper surface to a third roughness, which is less than the second roughness.

6. The method of claim 1, wherein forming the metal oxide layer on the bottom electrode comprises depositing the metal oxide layer over the bottom electrode.

7. The method of claim 1, further comprising:
forming a dielectric layer over the semiconductor substrate;
selectively forming openings in the dielectric layer;
wherein forming the bottom electrode comprises depositing the conductive material within one of the openings in the dielectric layer and also above dielectric layer; and
the bottom electrode interfaces with the metal oxide layer above the opening.

8. The method of claim 1, further comprising:
forming a dielectric layer over the semiconductor substrate; and
patterning the bottom electrode, the dielectric layer, and the top electrode to form an RRAM cell having edges;
wherein forming the bottom electrode comprises depositing the conductive material within and above an opening in the dielectric layer;
the dielectric layer has edges aligned to the edges of the RRAM cell; and
the edges of the dielectric layer aligned to the edges of the RRAM cell are outside the opening.

9. The method of claim 1, further comprising:
forming a dielectric layer with an opening over the semiconductor substrate; and
patterning the bottom electrode, the dielectric layer, and the top electrode to form an RRAM cell over the opening;
wherein forming the bottom electrode comprises depositing conductive material within the opening;
the opening has a maximum width; and
the dielectric layer within the RRAM cell has a width that is greater than the maximum width of the opening.

10. A method, comprising:
forming a bottom electrode layer for a memory cell in a metal interconnect structure;
applying chemical mechanical polishing to the bottom electrode layer to produce a surface on which an oxide is present;
using an acid wash to clean the surface;
bombarding the cleaned surface with ions;
depositing additional layers over the bottom electrode layer to form a memory cell stack; and
etching to form memory cells from the memory cell stack.

11. The method of claim 10, wherein the bombarding of the cleaned surface with the ions increases a density of the bottom electrode layer in a zone adjacent the surface.

12. The method of claim 11, wherein after the bombarding of the cleaned surface with the ions the bottom electrode layer has a higher density in the zone than below the zone.

13. The method of claim 10, wherein the bombarding of the cleaned surface with the ions flatten the cleaned surface.

14. The method of claim 13, wherein the bombarding of the cleaned surface with the ions reduces a roughness Ra of the surface to 2 nm or less.

15. The method of claim 10, wherein the acid wash comprises hydrofluoric acid (HF).

16. The method of claim 10, wherein the ions comprise argon (Ar) ions.

17. The method of claim 10, wherein:
the bottom electrode layer comprises a metal nitride; and
the surface comprises the metal nitride.

18. A method, comprising:
forming a lower portion of a metal interconnect structure over a semiconductor substrate;
forming a first conductive layer over the lower portion;
performing chemical-mechanical planarization (CMP) on the first conductive layer;
after the CMP, performing a wet etch on the first conductive layer;

after the wet etch, performing an ion bombardment on the first conductive layer;

after the ion bombardment, forming at least a data storage layer and a second conductive layer over the first conductive layer; and etching to define a memory cell comprising portions of the first conductive layer, the data storage layer, and the second conductive layer.

19. The method of claim 18, further comprising:

prior to forming the first conductive layer, forming a dielectric layer over the lower portion; and etching an opening in the dielectric layer;

wherein a portion of the first conductive layer deposits in the opening.

20. The method of claim 19, wherein the memory cell comprises a portion of the first conductive layer that is wider than the opening.

* * * * *